United States Patent [19]

Richardson

[11] 4,219,777

[45] Aug. 26, 1980

[54] DETECTOR FOR MULTIPLICITY OF RADIO WAVE FREQUENCIES

[76] Inventor: David Richardson, 2588 Knights Bridge La., Santa Clara, Calif. 95051

[21] Appl. No.: 857,468

[22] Filed: Dec. 5, 1977

[51] Int. Cl.² .................. H04B 1/26; H01Q 13/10
[52] U.S. Cl. .................................. 455/227; 455/81; 455/328; 329/161; 343/789; 340/600
[58] Field of Search ............... 325/363, 364, 445, 446, 325/24, 373, 340; 343/702, 768, 770, 771, 786, 789; 329/204, 205 TD, 161; 324/77 B; 333/31 A, 81 B, 83 R, 98 R, 98 S

[56] References Cited

U.S. PATENT DOCUMENTS

| | | | |
|---|---|---|---|
| 2,810,125 | 10/1957 | Deenean | 325/24 |
| 3,094,663 | 1/1963 | Siegel | 325/364 |
| 3,263,176 | 7/1966 | Riblet | 325/445 |
| 3,624,655 | 11/1971 | Sato | 343/786 |
| 3,707,161 | 10/1972 | Gregory | 343/789 |
| 3,932,815 | 1/1976 | Yuan | 325/445 |
| 3,980,974 | 9/1976 | Yamamoto | 325/24 |

Primary Examiner—Benedict V. Safourek
Assistant Examiner—Tommy P. Chin

[57] ABSTRACT

Apparatus for sensing the presence of one or more of a multiplicity of radio waves of distinct frequencies, using a single horn and one or more radiation-receiving apertures with associated circuitry.

41 Claims, 24 Drawing Figures

U.S. Patent   Aug. 26, 1980   Sheet 1 of 4   4,219,777
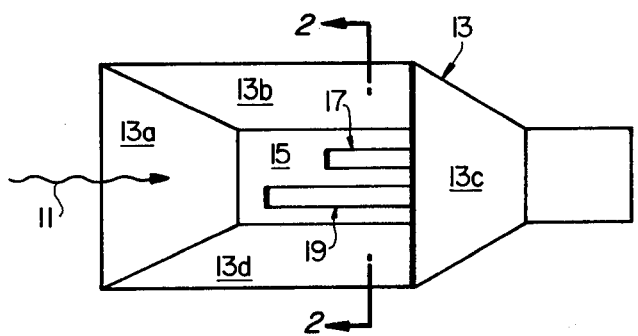
FIG_1
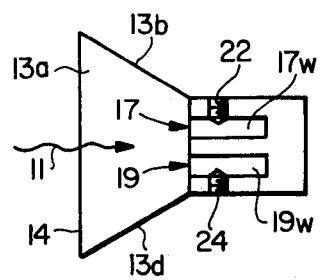
FIG_2
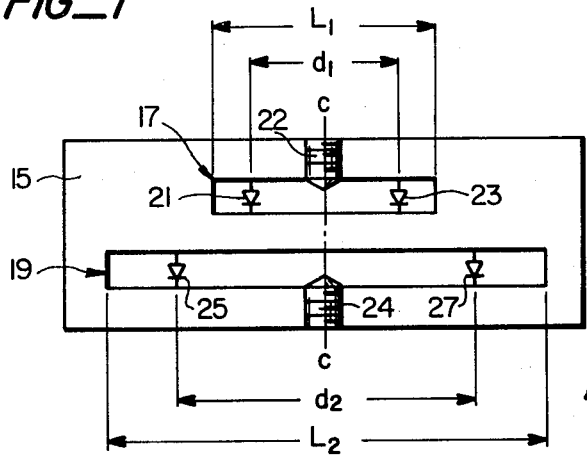
FIG_3
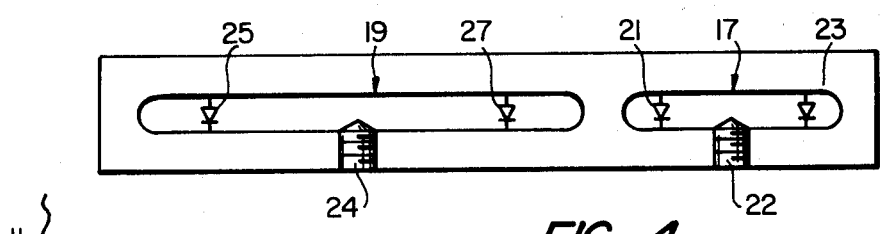
FIG_4
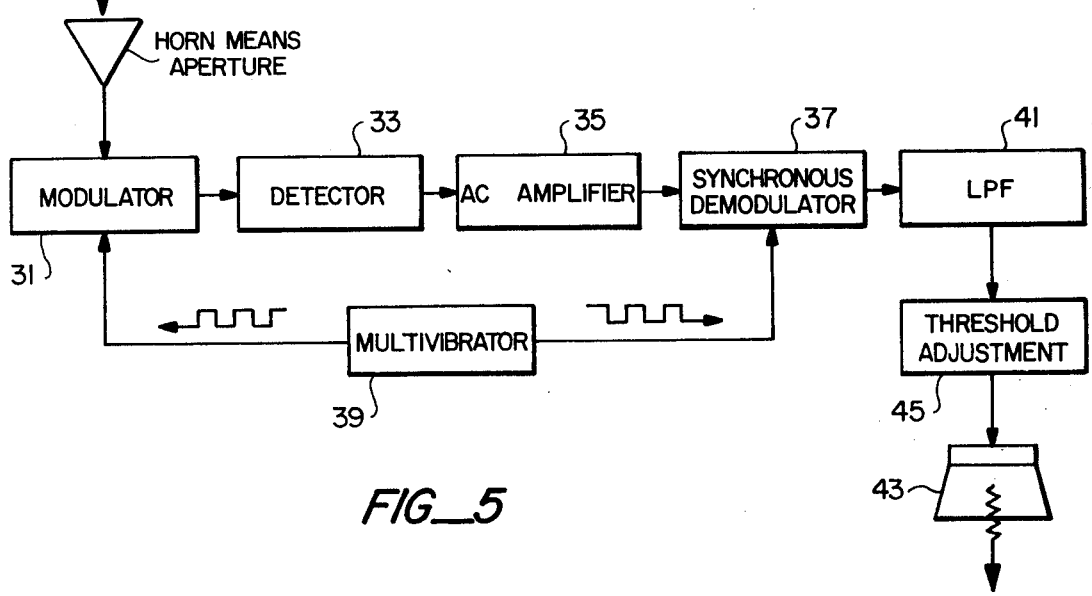
FIG_5

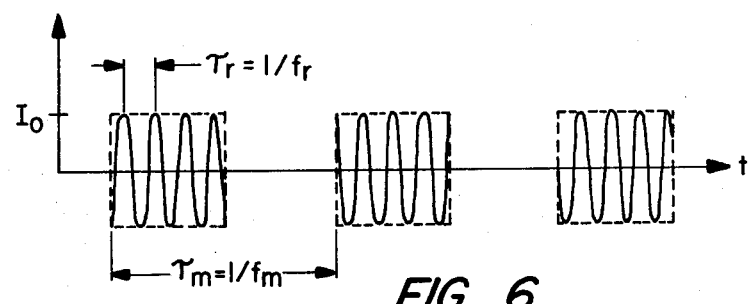
FIG_6
FIG_7
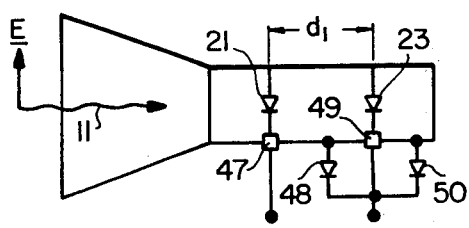
FIG_8
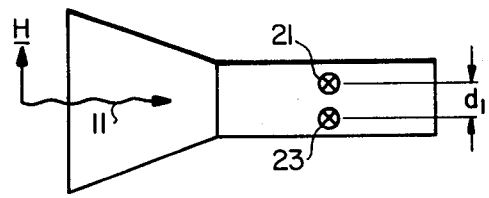
FIG_9
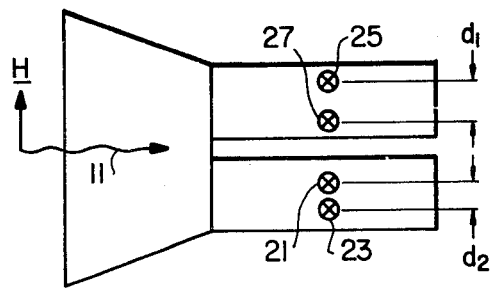
FIG_10
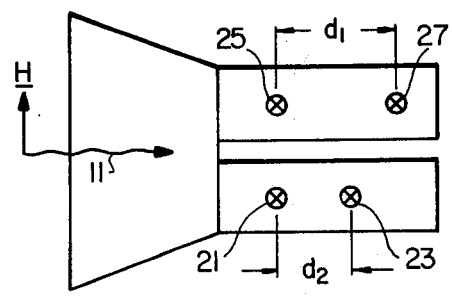
FIG_11
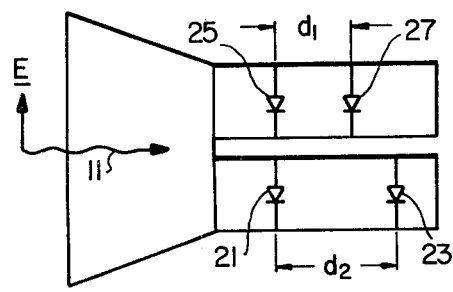
FIG_12
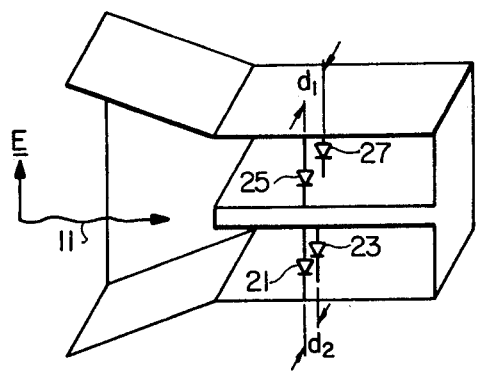
FIG_13

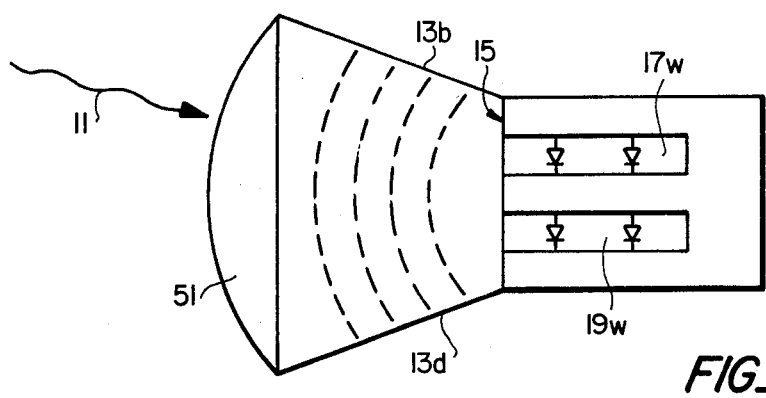
FIG_14
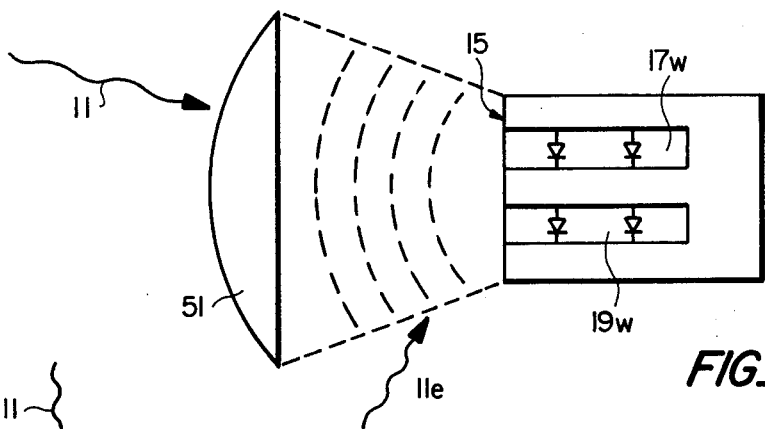
FIG_15
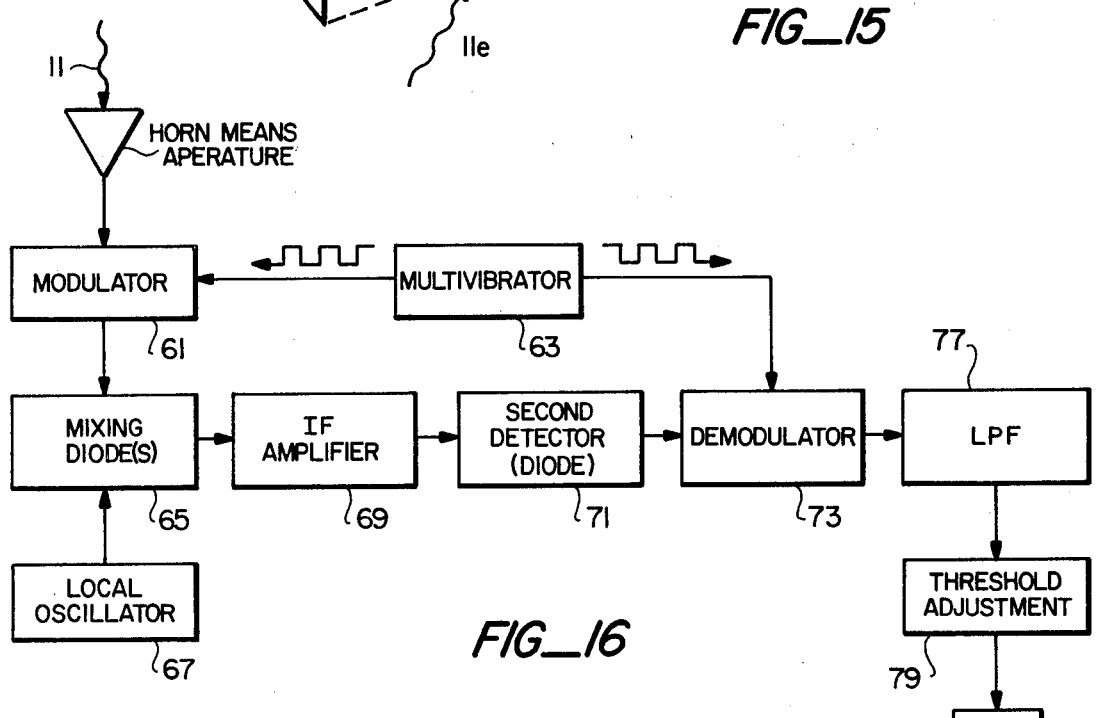
FIG_16
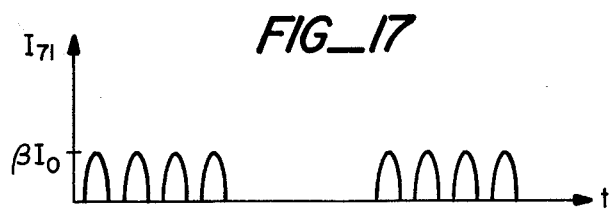
FIG_17

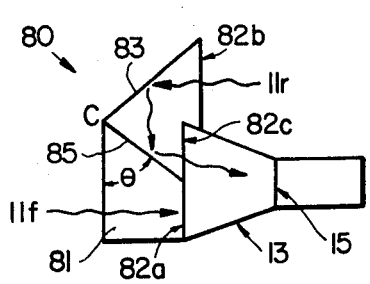
FIG_18
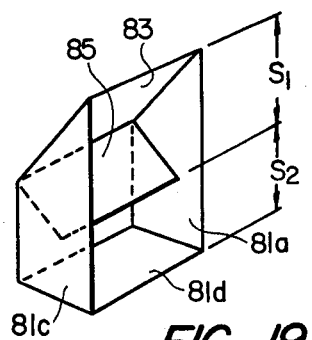
FIG_19
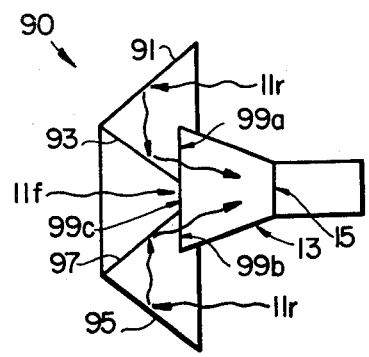
FIG_20
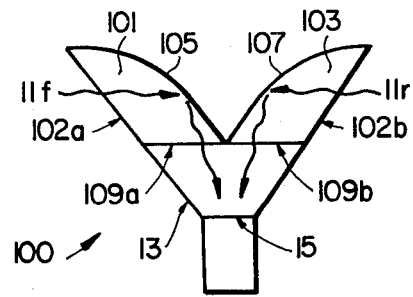
FIG_21
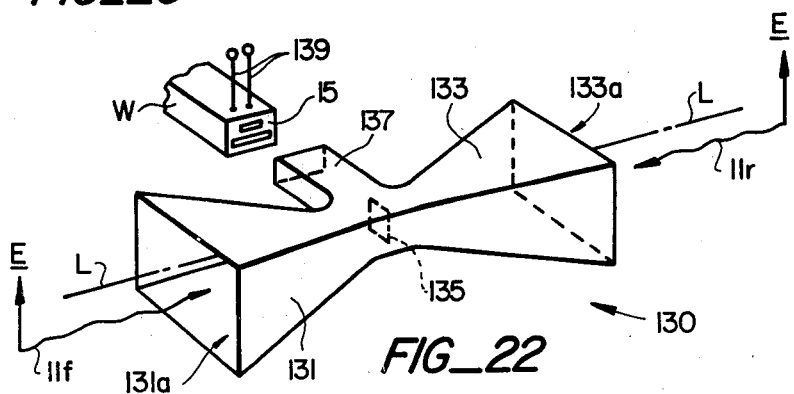
FIG_22
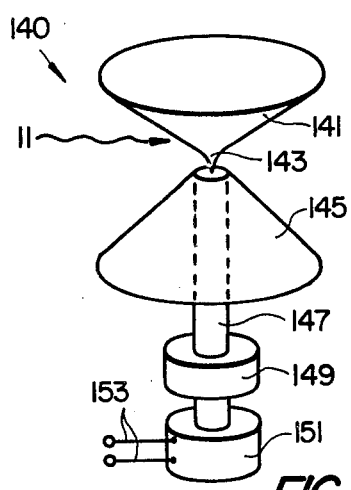
FIG_23
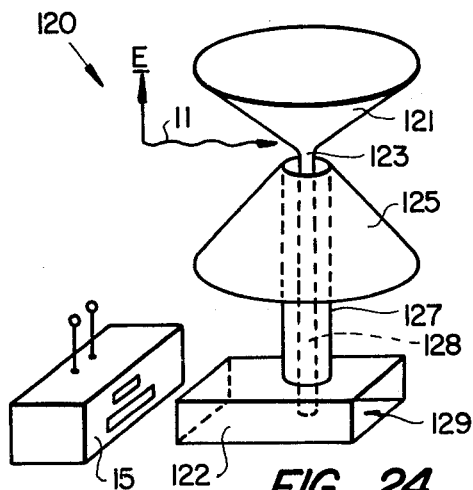
FIG_24

DETECTOR FOR MULTIPLICITY OF RADIO WAVE FREQUENCIES

FIELD OF THE INVENTION

The subject invention pertains to apparatus for detection of electromagnetic radiation substantially simultaneously for a multiplicity (one or a plurality) of frequencies.

BACKGROUND OF THE INVENTION

Apparatus for detection of the presence of radio waves has traditionally sensed the presence of waves at only one frequency or a narrow band of frequencies. Where two or more substantially separated frequencies are to be sensed simultaneously, the conventional approach has been to merely "stack" replicas of the frequency-sensing apparatus together, each apparatus being designed for detection of one frequency (or a narrow band surrounding same) of the substantially separated frequencies. This requires duplication of the radiation-receiving horn, the frequency discriminating aperture and the associated detection circuitry for each frequency to be sensed.

U.S. Pat. No. 3,094,663 to Siegel teaches and claims apparatus for sensing the presence of continuous wave or modulated microwave radiation at a particular frequency using an antenna, a detector diode and modulator diode connected in series with opposite polarities on opposite sides of the antenna, with the cathode ends of the diodes being connected across a capacitance and being alternately rendered conducting and non-conducting. A low frequency signal, sensed across the capacitance in the presence of the high frequency signal whose presence is to be detected, is used to drive an audio and/or visual output device, for example at a tone corresponding to the lower frequency (imposed) signal. The higher frequency signal is not passed by the capacitance; and the threshold for signal pickoff at the detector is set so that the low frequency signal is not sensed at the output devices, in the absence of the higher frequency signal. The Siegel apparatus passes the signal developed at the capacitance directly to the output device and does not use an intermediate demodulator or low pass filter.

The use of an antenna connected to a modulator, which is in turn connected to or through a modulation generator, and to a detector, is well known in the prior art for receiving and preparing a radio wave signal. Examples of such use are found in Melabs Proposal JPL No. 1480 for For A Venus Space Probe Radiometer (Aug. 19, 1960, FIG. 4, p. 15) and in F. D. Drake, "Radio Astronomy Receivers", 19 Sky and Telescope, Nos. 1 and 2 Nov. and Dec. 1959, p. 13).

SUMMARY OF THE INVENTION

The subject invention is apparatus for simultaneously detecting the presence of one or more of a multiplicity of substantially separate frequencies by use of a single horn and a sequence of waveguides and apertures in the horn end wall and appropriate circuitry, one waveguide, one aperture and one circuit being associated with each substantially separate frequency to be sensed.

The preferred embodiment of the subject invention includes radiation-receiving horn means; the horn end wall containing a sequence of apertures and associated waveguides, one such aperture being associated with each frequency to be detected; each aperture containing modulation and detection means for modulation and detection of a radar signal of the associated frequency entering the aperture; signal demodulation means; and an output device for the demodulated signal.

It is an object of the subject invention to provide a radio wave detector of increased sensitivity and compactness which allows detection of the presence of one or a plurality of substantially separate frequencies.

Other objects of the invention and advantages thereof will become clear from reference to the drawings and the detailed description.

BRIEF DESCRIPTION OF THE DRAWINGS

FIG. 1 is a perspective view of a horn used in the preferred embodiment, indicating the end wall and two frequency-discriminating apertures therein.

FIG. 2 is a sectional side view of the horn end wall of FIG. 1, indicating the waveguide associated with each aperture.

FIGS. 3 and 4 exhibit two embodiments of the horn end wall, indicating the approximate positions of the tuning screw and modulation and detection diodes associated with each aperture.

FIG. 5 is a schematic view of the circuits associated with the signal modulation and detection means of an aperture and associated waveguide in the preferred embodiment.

FIG. 6 is a graph of the radio wave signal (frequency $f_r$) and the impressed modulator signal (frequency $f_m$) as the composite signal emerges from the modulator of FIG. 5.

FIG. 7 is a graph of the modulation envelope signal as it issues from the detector and the AC amplifier of FIG. 5.

FIG. 8 shows the circuits for the modulation and the detection means for a single aperture, in the in-line embodiment, with E field orientation in the plane of the paper.

FIG. 9 shows schematically the arrangement for the modulation and detection means for a single aperture in the transverse embodiment, with H field orientation in the plane of the paper.

FIGS. 10 and 11 show schematically alternative arrangements for the modulation and detection means for two apertures in the stacked, in-line and transverse embodiments, with H field orientation in the plane of the paper.

FIGS. 12 and 13 show schematically alternative arrangements for the modulation and detection means for two apertures in the stacked, in-line and transverse embodiments, with the E field oriented in the plane of the paper.

FIG. 14 schematically shows a sectional side view of the radiation-receiving horn means, comprising a horn and a lens and the horn end wall.

FIG. 15 schematically shows a sectional side view of the radiation-receiving horn means, comprising a lens and an end wall.

FIG. 16 is a schematic view of the circuits associated with the signal modulation and detection means of an aperture and associated waveguide in an alternative superheterodyne embodiment.

FIG. 17 is a graphical representation of the (modulated) signal issuing from the second detector diode.

FIG. 18 is a sectional side view of a horn with end wall, with a preferred embodiment of the bidirectional radiation redirector attached near the entrance aperture of the horn.

FIG. 19 is a perspective view of the preferred embodiment of the bidirectional radiation redirector of FIG. 18.

FIG. 20 is a sectional side view of a second embodiment of a bidirectional radiation redirector, a symmetrized version of the embodiment of FIG. 18.

FIG. 21 is a sectional side view of a third embodiment of a (symmetric) bidirection radiation redirector.

FIG. 22 is a perspective of a bidirectional radiation redirector using a bi-horn as part of a radio wave T-junction.

FIG. 23 is a perspective view of an omnidirectional radiation redirector, using a bi-cone as part of a radio wave T-junction and allowing 360° sensing of incident radiation.

FIG. 24 is a perspective view of another embodiment of an omni-directional radiation redirector.

DETAILED DESCRIPTION

FIG. 1 shows a radio wave 11 (an alternating electromagnetic signal of frequency $f_r = 10^7$–$10^{11}$ Hz.) entering the entrance aperture of the horn 13 of the preferred embodiment. The horn here includes one or more connected side walls (here, 13a, b, c, d) defining the entrance aperture 14 (FIG. 2) and defining an end wall 15, upon which the other wall or walls terminate, near the rear of the horn. The end wall 15 may have one or more apertures 17, 19 therein to receive the incident radio wave 11 which is directed by the horn side walls toward the end wall. As indicated in FIG. 2, a sectional side view of FIG. 1, an end wall aperture 17 or 19 forms the mouth of a waveguide or cavity 17w or 19w which, acting in conjunction with a pair of diodes and a tuning screw (optional), discriminates against radio waves with wavelength substantially different from the chosen wavelength, in a well-known manner. The apertures and associated waveguides may be rectangular or substantially elliptical in cross section.

FIG. 3 shows the preferred embodiment of the horn end wall 15, where two substantially separate frequencies (or narrow bands of frequencies) are to be detected. In this configuration, the end wall apertures 17 and 19 are symmetrically arranged about a center line CC, one above the other, and are separated by a thickness of end wall material as shown; the thickness is made small so as to minimize the problems of parallax error which are a consequence of the non-coincidence of the centers of the two apertures. FIG. 3 also indicates the positions of the two diodes (21 and 23 and/or 25 and 27) within each associated cavity or waveguide, for purposes of modulation and detection of the incident radio wave of the appropriate frequency.

The diode pair 21 and 23 (and also the diode pair 25 and 27) may have one or both polarities reversed; Each of the four permutations of the diode pair (up-up, up-down, down-up and down-down) is operable in the subject invention, in contrast to the earlier cited invention of Siegel where the diode orientation appears to be crucial. Finally, a tuning screw (22 and/or 24: optional) may be provided in each waveguide for controlling and adjusting the frequency dependence of the waveguide and aperture impedance as seen from the external medium.

The two diodes 21 and 23 are spaced a distance $d_1$ apart near the mouth of or within the waveguide 17w as shown, where $d_1$ is preferably chosen in the range $0.005\lambda_{17} < d_1 < L_1 < 0.5\lambda_{17}$, with $\lambda_{17}$ the wavelength of the radio wave to be sensed by the associated waveguide 17w and detection means. Similarly, the two diodes 25 and 27 are positioned a distance $d_2$ apart where $0.005\lambda_{19} < d_2 < L_2 < 0.5\lambda_{19}$, with $\lambda_{19}$ the corresponding wavelength of the second radio wave to be sensed. Preferably, one also has $0.25\lambda_{17} < L_1 < 0.5\lambda_{17}$ and $0.25\lambda_{19} < L_2 < 0.5\lambda_{19}$.

The spacing $d_1$ or $d_2$ will be limited at the lower end by the physical size of the diode. If one or more chips, containing the diodes as part of an integrated package, are used, one could probably achieve $d_1 \lesssim 0.005\lambda_{17}$ and/or $d_2 \lesssim 0.005\lambda_{19}$. But if conventional diodes of normal size are used here, the finite (non-infinitesimal) diameter of each diode would likely limit the minimum diode spacings to $d_1 \gtrsim 0.1\lambda_{17}$ and $d_2 \gtrsim 0.1\lambda_{19}$.

One may, of course, include a plurality (more than two) of apertures and associated waveguides and modulation and detection means in the horn end wall, one such set being associated with each of the substantially separate frequencies to be sensed by the subject invention. One immediate problem encountered here is the development of parallax error, owing to the non-coincidence of the centers of the apertures in the end wall. In practice, one finds that the "substantially separate" frequencies can be within 25% of one another and still allow discrimination through use of the different apertures, waveguides and diode spacings.

FIG. 4 exhibits an alternative embodiment of the end wall aperture arrangement, wherein the apertures (two or more) are laid end-to-end as shown and the aperture and associated waveguides (not shown) have substantially elliptical cross sections. Here, the parallax problem is more severe as the aperture centers are even further displaced. The diodes 21 and 23, and also the diodes 25 and 27, are spaced apart within the respective waveguides as indicated in FIG. 3.

FIG. 5 is a schematic view of the signal modulation, detection and processing means associated with each waveguide. The radio wave 11, of intensity $1_o$ and appropriate frequency $f_r$ to be sensed, enters the horn means aperture and is modulated at 31 by an impressed train of square waves of frequency $f_m$, preferably about 2 KHz; modulation frequencies in the range $20 \text{ Hz} < f_m < 2 \times 10^6 \text{ Hz}$ might be used here. The resulting signal, shown in FIG. 6, is passed through the detector circuit 33 which produces the modulation envelope signal; this in turn is passed through an AC amplifier 35 (optional) to a synchronous demodulator 37, which also receives the pure modulation signal directly from multivibrator 39 which provides the original modulation signal. The signal issuing from the detector circuit and/or the AC amplifier 35 (FIG. 7) is proportional to the initial intensity $1_o$ ($\alpha 1_o$ where $\alpha$ is constant).

But the AC amplifier cannot follow the rapid ($f_r = 10^7$–$10^{11}$ Hz) variations of the input signal; and the resulting signal issuing from 33 or 35 is an approximate square wave with a small ripple at the top (FIG. 7), reflecting the input signal perambulations. The signals issuing from the detector circuit 33 (or the AC amplifier 35) and multivibrator 39 are both received by a synchronous demodulator 37 which forms the product of the two signals. The result (approximately) is two new time-varying signals, each proportional to $1_o$, with respective fundamental frequencies substantially equal to the sum (4 KHz) and difference (0 KHz) of the two 2 KHz multivibrator outputs. Each of these new signals is passed through a low pass filter 41 (optional, with cutoff frequency nominally 1 0Hz) which passes substantially only the subaudio component (0–200 Hz; again, proportional to $l_o$) to the audio and/or visual output device 43 that indicates the presence of the particular frequency to be sensed. For some applications, the cutoff frequency for the low pass filter may preferably be set somewhat higher, say at 1–2 KHz, especially where one is concerned with modulation information contained in the original radio wave signal 11.

If no low pass filter is used here, one may arrange the sensitivity of the output device 43 so that 43 does not respond to frequencies as high as 4 KHz (or higher); in effect, then, the output device will respond only to the lower frequency ($\sim$1.0 Hz) component. One possible disadvantage of this approach is the tendency of the threshold for activation of 45 to drift.

If no signal of that particular frequency or within that narrow band of frequencies is incident upon the horn, $l_o = 0$ and no signal ($\alpha l_o$) should arrive at the output device 43. The presence of noise in the system may cause a small (approximately dc) signal to issue from the low pass filter 41; and it may therefore be preferable to interpose a threshold adjustment device 45 between 41 and 43 which will pass only signals larger than some adjustable but pre-set threshold so as to avoid false alarms. Each aperture and associated waveguide might have its own associated processing circuitry, comprising the modulator 31, detector 33, AC amplifier 35 (optional), demodulator 37 and multivibrator 39; and all such processing circuits might share a common low pass filter 41 (optional) and audio and/or visual output device 43. Another possibility is the sharing of AC amplifier 35 (optional), demodulator 37, multivibrator 39, low pass filter 41 (optional) and audio and/or visual output device 43 in common between two or more separate sets of modulators 31 and detectors 33.

Two points of novelty of the subject invention appear to be: (1) the use of modulator means and detector means (both may be diodes) in a transverse or tandem arrangement (e.g., FIG. 9) rather than the more usual in-line arrangement (e.g., FIG. 8) and (2) the provision of stacking of two or more frequency-discriminating apertures and associated waveguides on the end wall of a single horn or energy lens.

FIG. 8 is a schematic view of a single waveguide apparatus and its associated diodes and circuitry, with the modulation diode 21 and the detection diode 23 arranged in-line, in a manner which is closer to the conventional approach. In all cases, the E field vector is preferably aligned parallel to the length or longitudinal direction of the diodes which extend across the waveguide. FIG. 9 is a schematic view of a single waveguide, with its diodes arranged in tandem as indicated in FIGS. 3 and 4 (if a single aperture were used). In all in-line and tandem arrangements of diodes shown (FIGS. 8–13), the positions of modulator and detector diodes may be exchanged. But each modulator diode circuit and each detector circuit contains a filter 47 and 49, respectively (shown only in FIG. 8, in the interest of euphony). Each detector circuit may further contain a clipper diode pair, comprising a pair of oppositely oriented diodes 48 and 50 in parallel with the output lead from the detector diode, for the purpose of suppressing excursions in voltage at this output lead. The forward bias of the diode 48 is preferably set at a higher turn-on voltage than the normal voltage across the detector diode 23.

Tandem, stacked and in-line, stacked arrangements of the diodes for the two adjacent waveguides are shown, respectively, in FIG. 10 (corresponds to FIGS. 3 and 4) and FIG. 11, viewed in the H field plane, and with the spacings ($d_1$ and $d_2$) of the associated diodes indicated. Another version of a stacked, in-line arrangement of the diodes, viewed in the E field plane, is shown in FIG. 12. Finally, FIG. 13 exhibits a stacked, tandem arrangement for the associated diode pairs, viewed in the E field plane. Apart from insubstantial modifications (such as arranging one diode pair in-line and the other diode pair in tandem, in a two waveguide apparatus), FIGS. 8–13 appear to represent all the possible diode pair arrangements for one and/or two waveguide apparati.

The radiation-receiving horn of FIG. 1 may be used together with a lens 51 of appropriate focal length positioned at the horn inlet, as shown in FIG. 14 for a two-aperture system. This arrangement has the advantage that the incident radiation 11 is focused more precisely on the end wall 15, and it results in increased sensitivity of the device. The lens might be constructed of a plastic which has a refractive index $n \sim 1.3-1.7$ at radio wave frequencies.

Alternatively, one might position a lens 51 at a distance corresponding to the lens focal point from an end wall containing one or more apertures and associated waveguides, as shown in FIG. 15. The lens will tend to focus incident radiation 11 arriving frontally as shown; but this arrangement has the disadvantage that extraneous radiation 11e arriving from the side will also reach the aperture(s) and may produce unacceptable noise levels in the system.

An alternative embodiment, using a superheterodyne philosophy, is indicated in FIG. 16. The incident radiation 11 (e.g., $A\sin 2\pi ft$.) arrives at the horn means aperture as before and is modulated at 61 by a square wave signal ($f_m \sim 2$ KHz) from a multivibrator 63. The resulting modulated signal then enters a mixing diode or diodes 65 and is added to (or subtracted from) an offset signal ($B \sin(2\pi f't + \phi)$) provided by a local oscillator 67, and the resulting sum or difference signal is substantially squared. The frequency f' is preferably chosen close to but not within the narrow band of frequencies from which the signal ($A \sin 2\pi ft$.) to be sensed is drawn so that $|f'-f|$ is never less than some minimum value. For example, if one seeks to detect incident X-band radiation (8.2 GHz<f<12.4 GHz), one might choose f'=12.5 GHz and insure that $|f'-f| \geq 0.1$ GHz.

The mixed and substantially squared signal, containing sinusoidal terms with frequencies $|f-f'|$, $f+f'$, $2f$ and $2f'$, is then input to an IF amplifier 69 which, inter alia, removes the latter three high frequency signals by its own inherent low pass or band pass characteristics. The signal received at 69 is now a strong one, by virtue of the heterodyning technique previously applied, and conventional amplifiers may be used here. The output of 69 is then passed to a rectifier diode, commonly called a second detector diode, 71 which acts as a half wave or full wave rectifier and produces a rectified, substantially, sinusoidal signal, indicated in FIG. 17. The output of 71 (including a dc component, modulated at 2 KHz) is then passed to a demodulator 73, which also receives the original modulation signal from the multivibrator 63. The resulting signal issuing from 73 is, as in FIG. 5, a sum of a "low" frequency component ($\sim 0$ KHz) and a "high" frequency component ($\sim 4$ KHz).

As before, one may pass this signal through a low pass filter 77 (optional) to remove the "high" frequency component and pass the final signal through the audio and/or video output device 75; or one may dispense with the low pass filter 77, pass the demodulated signal from 73 directly to the output device 75, and rely upon the internal or built-in high frequency insensitivity of said device to cause said device to respond substantially only to the low frequency component. Again, a threshold adjustment device 79 (optional) may be used to reduce the probability of false alarms signals being received at the output device 75.

The subject invention discussed thus far is primarily useful for detecting radiation coming substantially only from the direction in which the entrance aperture of the horn 13 (FIG. 1) is oriented. An alternative embodiment uses the radiation-receiving horn 13 together with the bidirectional radiation redirector 80, shown attached to the front of the horn (or horn means) in FIG. 18, to collect radiation approaching from the front (11f) and/or from the rear (11r) simultaneously. The radiation approaching from the front passes through a partial aperture 82a in the lower part of the horn or horn means entrance aperture, and is directed toward the end wall 15 of the horn or horn means as before. The radiation approaching from the rear first passes through a partial aperture 82b, is then reflected once from each of two highly reflecting surfaces 83 and 85 as shown, passes through another partial aperture 82c, in the horn or horn means entrance, and is also directed toward the end wall 15 of the horn or horn means as shown.

The radiation redirector, shown in one embodiment in FIGS. 18 and 19, consists of two parallel walls 81a and 81c, spaced apart and connected by a third (perpendicular) wall 81d and by two obliquely oriented walls 83 and 85. The surfaces of 81(a, c, d), 83 and 85 are preferably highly reflective to radio wave signals in the frequency range(s) of interest so as to efficiently (re)direct the radio wave signals 11f and/or 11r into the horn or horn means entrance apertures. A radio wave signal 11f incident from the front senses a smaller aperture (82a) size than would be present with the radiation redirector device 80 removed. If the area of the partial aperture 82a is chosen to be substantially half the entrance aperture area of the bare horn or horn means, the gain associated with a signal 11f will be reduced 3–5 db by the addition of the radiation redirector 80. Similarly, the gain associated with a signal 11r will be reduced 3–5 db by the addition of the radiation redirector 80. Fortunately, the detector itself is sufficiently sensitive that this loss in gain is not noticeable for radio wave signal strengths normally encountered.

The obliquely oriented wall 85 (FIG. 18) may be made adjustable so as to vary the relative areas of the partial apertures 82a and 82c, thus allowing compensation for different (expected) strengths in the incident radiation 11f and 11r. One possibility here is to hinge the wall 85 at the corner C (FIG. 18) so as to allow the relative areas of the partial apertures 82a and 82c to vary as $\theta$ varies. This approach is satisfactory only if the range of $\theta$ is suitably restricted so as to allow (re)reflection of the reflected radiation on to the horn means end wall for all values of $\theta$ in said range. Another possibility for varying the relative partial aperture areas 82a and 82c would allow the walls 83 and 85, considered as a rigid unit with $\theta$ fixed, to slidably move upward and downward relative to the horn means 13; this requires a more complex structure for 80 but does preserve the angle $\theta$ and thus the direction of the radiation 11r that is reflected off wall 85.

FIG. 20 exhibits a symmetrized version 90 of the radiation redirector shown in FIG. 18. The radiation 11f arriving from the front enters the horn means through a partial aperture 99c and proceeds toward the horn means end wall. The radiation 11r arriving from the rear is reflected once each from the highly reflective walls 91 and 93 (alternatively, 95 and 97), enters the horn means through a partial aperture 99a (alternatively, 99b), and proceeds toward the horn means end wall 15. The associated loss of gain of the apparatus 90 is 3–5 db in either individual direction (front or rear).

Another two-way radiation redirector is shown in FIG. 21, wherein the redirector 100 is substantially symmetrically constructed, with the incident radiation reflected only once before its receipt at the horn means end wall 15. The incident radiation 11f (11r) enters through aperture 102a (102b), is reflected once off a straight or suitably curved highly reflective rear wall 105 (107), and proceeds toward the horn means end wall 15 through a partial aperture 109a (109b). The side walls 101 and 103 are optional, but are useful in excluding extraneous signals arriving from other directions. This arrangement has an associated loss in gain of 6–9 db in either individual direction.

The polarization of the incident radiation may have either orientation (E- or H-) in these latter three embodiments; change from E- to H-orientation merely requires a different orientation, in the waveguide, of the diodes associated with the modulation circuit means (and detection circuit means, if present), as suggested by a comparison of FIGS. 8–13 herein.

Another embodiment of the bidirection radiation redirector is shown in FIG. 22, which employs a bi-horn 130 and suitable radiation obstruction means 135 to redirect the incident radiation 11f and/or 11r into a waveguide 137 having an end wall 15 containing, as before, one aperture for each frequency to be detected. A bi-horn, as employed here, comprises two component horns 131 and 133, joined together substantially collinearly at or near their apex ends so that the entrance apertures 131a and 133a of the two component horns are oriented in substantially opposing directions; the horn end walls are removed so that the joined horns permit a more-or-less clear line of sight LL, looking from one horn entrance aperture through to the other entrance aperture.

Considering the two component horns as waveguide "arms" for the passage of radiation therethrough, one or more additional waveguide "arms" 137 is now added, where the interior of this latter waveguide is in electromagnetic communication with the horn interiors. This latter waveguide is oriented noncollinearly with the line of sight LL, but said waveguide permits the removal of at least a portion of the radiation 11f and/or 11r entering the bi-horn. This is accomplished through the interposition of radiation obstruction means, such as a septum or small flat plate or tuning screw 135 (optional), located approximately where the two horn components join together and oriented substantially perpendicular to the direction of flow of incident radiation within one or both component horns, in order to substantially match the bi-horn impedance to the impedance of the waveguide arm 137. The radiation obstruction means locally interrupts the unimpeded propagation of radiation and, pursuant to Huygens principle on wave propagation, a portion of this electromagnetic energy (with frequency unchanged) is redirected into the waveguide "arm" 137, toward the end wall 15 and frequency-discriminating aperture(s) therein.

The use of radiation obstruction means 135 is optional here as the incident radiation 11f and/or 11r will encounter other obstructions within the bi-horn which will cause a portion of the radiation to be directed into and along the waveguide arm 137. Beyond the end wall 15 in FIGS. 18-22, the remainder of the apparatus is as before.

FIG. 22 shows two diode leads 139, indicating tandem diode orientation in a configuration suitable for detection of incident radiation, where the radiation E-field is oriented as shown; the in-line diode arrangement is also available here, requiring the obvious changes. If the E-field shown here is replaced by the H-field, the diode lead(s) 139 would exit from one side of the waveguide w rather than from the top or bottom thereof.

Finally, two representative embodiments of omnidirectional (360°) radiation redirectors are shown in FIGS. 23 and 24. In FIG. 23, the linearly or circularly polarized radiation 11 enters the interior of a bi-cone 140, which comprises two separated cones, oriented collinearly with the apices of the cones substantially coincident as indicated. One of the two cones 145 (the "bottom" cone, as distinguished from the "top" cone) further has a hollow waveguide (which may be substantially elliptical or rectangular) formed therein and oriented substantially along the cone axis. The top cone 141 may have a septum or other radiation obstruction means 143 (optional) located in the vicinity of the cone apex which causes a portion of the incident radiation to be redirected into and along the waveguide 147. This redirected radiation passes through a circular-to-linear polarization conversion device 149 (optional), which is of conventional design, and is then directed to a frequency discrimination and detection apparatus 151 which includes a horn means or waveguide end wall (not shown), with frequency-discriminating apertures therein, and modulation circuit means and detection circuit means as before. One or more diode lead pairs (153) are brought out of the discrimination and detection apparatus 151 and passed to the circuits shown in FIG. 5 and/or FIG. 16.

Another omni-directional embodiment, shown in FIG. 24, also employs a bi-cone 120, including cones 121 and 125, with a hollow, concentric waveguide 127 as before, but with a coaxial inner waveguide 128, smoothly connected to the top cone 121 at 123 as shown, replacing the obstruction means in FIG. 23. Here, the electric field vector of the incident radiation 11 must be oriented substantially in the plane of incidence as shown. As before, a portion of the incident radiation 11 is redirected into and along the annular waveguide defined by 127 and 128 to a coaxial-to-waveguide conversion apparatus 129, constructed in the well-known manner. Another waveguide 122, which may be substantially elliptical or rectangular in cross section, (re)directs the radiation toward an end wall 15 with one or more frequency-discriminating apertures 60 therein as above, and the remainder of the detection apparatus is arranged as above.

Although the preferred embodiments of the subject invention have been shown and described herein, it should be clear that modification and variation may be made without departing from what is considered to be the invention.

I claim:

1. Apparatus for detection of the presence of incident ratio waves of at least one of a multiplicity of substantially separate frequencies in the ambient medium, the apparatus comprising:
   radiation-receiving horn means, having an entrance aperture, for receiving the radio waves;
   the horn means having an end wall containing at least two apertures, with one aperture for each frequency to be detected;
   each of the apertures having an end wall length L that is substantially 25-50% of the wavelength corresponding to the frequency of the radio waves to be detected;
   a wave guide associated with each aperture, positioned within the horn end wall and terminating at the associated aperture, and having substantially the same transverse cross section dimensions as the associated end wall aperture;
   modulation circuit means, one being operatively associated with each waveguide, for generating a modulation signal and for impressing the modulation signal upon the radio wave signal received by the aperture and associated waveguide, to produce a modulated radio wave signal;
   detection circuit means, one being operatively associated with each waveguide and the associated modulation circuit means, for receiving the modulated radio wave signal of the appropriate frequency and for generating a modulation envelope signal that is substantially a replica of the modulation signal;
   demodulation means for receiving the modulation signal and the modulation envelope signal and, in response thereto, for generating a demodulated signal that is substantially the product of the two signals received;
   an ac amplifier through which the modulation envelope signal is passed to the demodulation means; and
   output signal means for receiving the demodulated signal and, in response thereto, for generating an output signal, indicative of the presence of the radio wave frequency to be detected, which is perceived by an operator of the apparatus.

2. Apparatus according to claim 1, wherein said modulation circuit means and said detector circuit means each includes a diode, the two diodes being mounted in spaced relation to one another in said associated waveguide.

3. Apparatus according to claim 2, wherein said waveguide further includes a turning screw, positioned substantially in the plane defined by the two diodes, for varying the electrical input impedance of said aperture.

4. Apparatus according to claim 2, wherein said two diodes are mounted transversely in said associated waveguide and are spaced a distance d apart where $0.005\lambda < d < 0.5\lambda$.

5. Apparatus according to claim 2, further including clipping circuit means which comprises:
   two diodes, arranged in parallel and of opposite polarity, each diode being electrically connected to the output of said detection circuit means so that each such diode acts as a shunt across said detection circuit means diode;
   with the turn-on voltage of the clipping circuit means diode whose polarity agrees with the polarity of said detection circuit means diode, having a higher value than the turn-on voltage of said detection circuit means diode;

whereby a large excursion of the voltage across said detection circuit means diode is prevented from damaging said detection circuit means.

6. Apparatus according to claim 2, wherein said two diodes are mounted longitudinally in said associated waveguide and are spaced a distance d apart where $0.005\lambda < d < 0.25$.

7. Apparatus according to claim 1, further including threshold adjustment means, operatively associated with said demodulator means and with said output signal means, for passing only that portion of the demodulated signal to said output signal means which exceeds a predetermined threshold signal magnitude.

8. Apparatus according to claim 1, further including a low pass filter, connected to said demodulator means, which receives the demodulated signal from said demodulator means and passes only signal components with frequencies substantially below a predetermined subaudio threshold frequency.

9. Apparatus according to claim 8, wherein said predetermined subaudio threshold frequency is substantially 1.0 Hz.

10. Apparatus according to claim 1, whereon said horn means is a horn with an end wall plus a lens positioned at the inlet of the horn to focus the incoming radio substantially onto said end wall between two contiguous end wall apertures.

11. Apparatus according to claim 1, whereinsaid horn means is an end wall and a lens that is positioned to focus the radio waves which are incident upon the lens substantially onto said end wall aperture between two contiguous end wall apertures.

12. Apparatus according to claim 1, further including a bid-directional radiation redirector positioned adjacent to said horn means entrance aperture, the redirector comprising:
a first substantially planar wall, positioned to intercept radiation substantially incident from the rear of said horn means and to reflect the incident radiation substantially toward said entrance aperture of said horn means;
a second substantially planar wall, substantially contiguous with the first wall at an edge thereof and oriented substantially perpendicularly to the first wall and positioned to intercept the radiation reflected from the first wall and to reflect this radiation substantially through said horn means entrance aperture and toward said horn means end wall;
the first and second walls being composed of a material that is highly reflective to radio waves for each of the wavelengths λ to be detected;
the first and second walls being positioned so as to allow radiation incident from the front of said horn means to enter said horn means entrance aperture and to proceed toward said horn means end wall,
whereby radiation incident upon said horn means from the front and radiation incident upon said horn means substantially from the rear are each directed through said horn means entrance aperture toward said horn means end wall.

13. Apparatus according to claim 12, wherein each redirector includes two of said first wall and two of said second wall,
with the first pair of said first wall and said second wall being spaced apart from the second pair of said first wall and said second wall.

14. Apparatus according to claim 1, further including a bidirectional radiation redirector, positioned adjacent to said horn means entrance aperture, the redirector comprising:
a first wall, positioned to intercept radiation incident from a first direction and to reflect the radiation substantially through said horn means entrance aperture and toward said horn means end wall;
a second wall, positioned to intercept radiation incident from substantially the opposite direction and to reflect this radiation substantially through said horn means entrance aperture and toward said horn means end wall;
the first and second walls being composed of material that is highly reflective to radio waves for each of the wavelengths λ to be detected,
whereby radiation incident upon said horn means from one direction and radiation incident upon said horn means from substantially the opposite direction are each directed through said horn means entrance aperture and toward said horn means end wall.

15. Apparatus according to claim 1 wherein said horn means comprises:
a bi-horn, having a bi-horn axis;
an auxiliary waveguide, joined to and in electromagnetic communication with the bi-horn near the apices of the two component horns that form the bi-horn; and
the auxiliary waveguide having an axis that is non-collinear with the bi-horn axis.

16. Apparatus according to claim 15, further including radiation obstruction means, positioned near the location where said auxiliary waveguide joins said bi-horn, for redirecting a portion of the radiation which enters either component horn of the bi-horn into said auxiliary waveguide.

17. Apparatus according to claim 15, wherein one transverse dimension d of said auxiliary waveguide satisfies $d \geq \frac{1}{2}\lambda_{max}$, where $\lambda_{max}$ is the maximum wavelength to be detected by said apparatus.

18. Apparatus according to claim 1, wherein said horn means comprises:
a bi-cone, including an upper cone and a lower cone which have substantially collinear axes;
the lower cone having an auxiliary waveguide therethrough, with the auxiliary waveguide axis being substantially coincident with the lower cone axis; and
the auxiliary waveguide having an end wall containing one aperture for each frequency to be detected,
whereby the direction of arrival at said horn means of the incident radiation to be sensed may be any direction substantially in a plane.

19. Apparatus according to claim 18, further including polarization conversion means for converting circularly polarized radiation to linearly polarized radiation in said auxiliary waveguide.

20. Apparatus according to claim 1, wherein said horn means comprises:
a bi-cone, including an upper cone and a lower cone which have substantially collinear axes;
the lower cone having an auxiliary waveguide therethrough, with the auxiliary waveguide axis being substantially coincident with the lower cone axis;
a tube, depending from the upper cone substantially at the apex of the upper cone, positioned inside the lower cone auxiliary waveguide and being substantially coaxial therewith so as to form an annular region between the walls of the auxiliary waveguide and the tube to guide the portion of incident radiation that is redirected into the auxiliary waveguide;

a second auxiliary waveguide, with waveguide axis oriented noncollinearly with respect to the first auxiliary waveguide axis, having an end wall containing one aperture for each frequency to be detected; and coaxial-to-waveguide conversion means, operatively associated with the first and second auxiliary waveguides, for redirecting the radiation in the first auxiliary waveguide into the second auxiliary waveguide, whereby the direction of arrival at said horn means of the incident radiation to be sensed may be any direction in a plane.

21. Apparatus for detection of the presence incident radio waves of at least one of a multiplicity of substantially separate frequencies in the ambient medium, the apparatus comprising:

radiation-receiving horn means, having an entrance aperture, for receiving the radio waves;

the horn means having an end wall containing one aperture for each frequency f to be detected;

each of the apertures having an end wall length L which is substantially 20–50% of the wavelength $\lambda$ corresponding to the frequency of one of the radio waves to be detected;

a waveguide associated with each aperture, positioned within the horn end wall and terminating at the associated aperture;

modulation circuit means, one being operatively associated with each waveguide, for generating a modulation signal and for impressing the modulation signal upon the radio wave signal received by the aperture and associated waveguide, to produce a modulated radio wave signal;

signal mixing means, one being operatively associated with each waveguide and the associated modulation circuit means, for generating an offset signal of predetermined frequency f', adjacent to but differing from the frequency f, for adding the offset signal to the modulated radio wave signal received from the associated modulation circuit means, and for forming substantially the square of the resulting sum, to produce a mixed modulation radio wave signal;

an IF amplifier, electrically connected to the signal mixing means, to receive the mixed modulated radio wave signal and to amplify all sinusoidal components of the received signal having frequencies within a predetermined band of frequencies which includes the difference frequency $|f-f'|$, to produce an IF amplifier signal;

rectifier means, operatively associated with the signal mixing means and the IF amplifier, for rectifying the IF amplifier signal to produce a rectified IF amplifier signal;

demodulator means for receiving the modulation signal and the rectified IF amplifier signal and, in response thereto, for generating a demodulated signal which is substantially the product of these two signals; and output signal means for receiving the demodulated signal and, in response thereto, for generating an output signal, indicative of the presence of the radio wave frequency to be detected, which is perceived by the operator of the apparatus.

22. Apparatus according to claim 21, wherein said modulation circuit means includes a diode mounted in said associated waveguide.

23. Apparatus according to claim 22, wherein said associated waveguide further includes a timing screw positioned adjacent to said aperture, for varying the electrical input impedance of said aperture.

24. Apparatus according to claim 21, wherein said horn means end wall contains two of said apertures, with said two apertures being oriented substantially parallel along the longest direction of said apertures.

25. Apparatus according to claim 21, wherein said aperture and said associated waveguide are both substantially rectangular in cross-section.

26. Apparatus according to claim 21, wherein said aperture and said associated waveguide are both substantially elliptical in cross section.

27. Apparatus according to claim 21, further including threshold adjustment means, operatively associated with said demodulator means and with said output signal means, for passing only that portion of the demodulated signal to said output signal means which exceeds a predetermined threshold signal magnitude.

28. Apparatus according to claim 21, further including a low pass filter, connected to said demodulator means, which receives the demodulated signal from said demodulator means and passes only signal components with frequencies substantially below a predetermined threshold frequency.

29. Apparatus according to claim 28, wherein said predetermined threshold frequency is substantially 0.1Hz.

30. Apparatus according to claim 21, wherein said horn means is a horn with an end wall.

31. Apparatus according to claim 21, wherein said horn means is a horn with an end wall plus a lens positioned at the inlet of said horn to focus the incoming radio waves substantially onto said end wall aperture.

32. Apparatus according to claim 21, wherein said horn means is an end wall with a lens positioned to focus the incoming radio waves substantially onto said end wall aperture.

33. Apparatus according to claim 21, further including a bi-directional radiation redirector positioned adjacent to said horn means entrance aperture, the redirector comprising:

a first wall, positioned to intercept radiation incident from the rear of said horn means and to reflect the incident radiation substantially toward said entrance aperture of said horn means;

a second wall, adjacent to the first wall and positioned to intercept the radiation reflected from the first wall and to reflect this radiation substantially through said horn means entrance aperture and toward said horn means end wall;

the first and second walls being composed of material which is highly reflective to radio waves for each of the wavelengths to be detected;

the first and second walls being positioned so as to allow radiation incident from the front of said horn means to enter said horn means entrance aperture and to proceed substantially toward said horn means end wall, whereby radiation incident upon said horn means from the front and radiation incident upon said horn means from the rear are each directed through said horn means entrance aperture and toward said horn means end wall.

34. Apparatus according to claim 33, wherein each redirector includes two of said first wall and two of said second wall.

35. Apparatus according to claim 21, further including a bidirectional radiation redirector, positioned adjacent to said horn means entrance aperture, the redirector comprising
- a first wall, positioned to intercept radiation incident from one side of said horn means and to reflect the incident radiation substantially through said horn means entrance aperture and toward said horn means end wall;
- a second wall, positioned to intercept radiation incident from substantially the opposite side of said horn means and to reflect this radiation substantially through said horn means entrance aperture and toward said horn means end wall;
- a second wall, positioned to intercept radiation incident from substantially the opposite side of said horn means and to reflect this radiation substantially through said horn means entrance aperture and toward said horn means end wall;
- the first and second walls being composed of material which is highly reflective to radio waves for each of the frequencies to be detected, whereby radiation incident upon said horn means from one side and radiation incident upon said horn means from substantially the opposite side are each directed through said horn means entrance aperture and toward said horn means end wall.

36. Apparatus according to claim 21, wherein said horn means comprises:
- a bi-horn, having a bi-horn axis;
- an auxiliary waveguide, joined to and in electromagnetic communication with the bi-horn near the apices of the two component horns which form the bi-horn; and
- the auxiliary waveguide axis being non-collinear with the bi-horn axis, and the auxiliary waveguide having an end wall containing one aperture for each frequency to be detected.

37. Apparatus according to claim 36, further including radiation obstruction means, positioned near the location where said auxiliary waveguide joins said bi-horn, for redirecting a portion of the radiation which enters either component horn of the bi-horn into said auxiliary waveguide.

38. Apparatus according to claim 36, wherein one transverse dimension d of said auxiliary waveguide satisfies $d \geq \frac{1}{2}\lambda_{max}$, where $\lambda_{max}$ is the maximum wavelength to be detected by said apparatus.

39. Apparatus according to claim 21, wherein said horn means comprises:
- a bi-cone, including an upper cone and a lower cone and a lower cone which have substantially collinear axes;
- the lower cone having an auxiliary waveguide therethrough, with the auxiliary waveguide axis being substantially coincident with the lower cone axis; and
- the auxiliary waveguide having an end wall containing one aperture for each frequency to be detected,
- whereby the direction of arrival at said horn means of the incident radiation to be sensed may be any direction substantially in a plane.

40. Apparatus according to claim 39, further including polarization conversion means for converting circularly polarized radiation to linearly polarized radiation in said auxiliary waveguide.

41. Apparatus according to claim 21, wherein said horn means comprises:
- a bi-cone, including an upper cone and a lower cone which have substantially collinear axes;
- the lower cone having an auxiliary waveguide therethrough, with the auxiliary waveguide axis being substantially coincident with the lower cone axis;
- a tube, depending from the upper cone substantially at the apex of the upper cone, positioned inside the lower cone auxiliary waveguide and being substantially coaxial therewith so as to form an annular region between the walls of the auxiliary waveguide and the tube to guide the portion of incident radiation that is redirected into the auxiliary waveguide;
- a second auxiliary waveguide, with waveguide axis oriented noncollinearly with respect to the first auxiliary waveguide axis, having an end wall containing one aperture for each frequency to be detected; and
- coaxial-to-waveguide conversion means, operatively associated with the first and second auxiliary waveguides, for redirecting the radiation in the first auxiliary waveguide into the second auxiliary waveguide,
- whereby the direction of arrival at said horn means of the incident radiation to be sensed may be any direction in a plane.

* * * * *